(12) United States Patent
Shimizu et al.

(10) Patent No.: US 12,610,485 B2
(45) Date of Patent: Apr. 21, 2026

(54) ELECTRIC DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Hiroshi Shimizu, Osaka (JP); Hitoshi Takeda, Osaka (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 113 days.

(21) Appl. No.: 18/686,662

(22) PCT Filed: Aug. 18, 2022

(86) PCT No.: PCT/JP2022/031188
§ 371 (c)(1),
(2) Date: Feb. 26, 2024

(87) PCT Pub. No.: WO2023/032697
PCT Pub. Date: Mar. 9, 2023

(65) Prior Publication Data
US 2024/0357759 A1 Oct. 24, 2024

(30) Foreign Application Priority Data
Sep. 3, 2021 (JP) ................................. 2021-143693

(51) Int. Cl.
*H02G 5/02* (2006.01)
*H05K 5/02* (2006.01)

(52) U.S. Cl.
CPC ............. *H05K 5/0247* (2013.01); *H02G 5/02* (2013.01)

(58) Field of Classification Search
None
See application file for complete search history.

(56) References Cited

U.S. PATENT DOCUMENTS 5,822,189 A * 10/1998 Isshiki ................. H01R 9/2425
361/728
7,470,130 B2 * 12/2008 Kubota ............... B60R 16/0238
439/949

(Continued)

FOREIGN PATENT DOCUMENTS

| JP | H7-169519 A | 7/1995 |
| JP | 2006-203976 A | 8/2006 |
| JP | 2014-220898 A | 11/2014 |

OTHER PUBLICATIONS

International Search Report, Application No. PCT/JP2022/031188, mailed Nov. 1, 2022. ISA/Japan Patent Office.

*Primary Examiner* — Xanthia C Relford
(74) *Attorney, Agent, or Firm* — Honigman LLP

(57) ABSTRACT

An electric device includes: a case; an electronic component having a terminal and disposed in the case; and a busbar disposed in the case and laser-welded to the terminal. The terminal of the electronic component and the busbar overlap each other, the case has an opening portion, and one or both of the terminal of the electronic component and the busbar are exposed to the outside of the case through the opening portion. The case has a first sandwiching portion configured to come into contact with one of the terminal of the electronic component and the busbar, and a second sandwiching portion configured to come into contact with the other of the terminal of the electronic component and the busbar, and relative positions of the terminal of the elec- (Continued)

tronic component and the busbar are held as a result of sandwiching by the first sandwiching portion and the second sandwiching portion.

11 Claims, 8 Drawing Sheets

(56)                References Cited

U.S. PATENT DOCUMENTS 8,669,472 B2 *  3/2014  Plummer ............... H02G 5/005
                                                  174/70 B
2020/0168419 A1    5/2020  Fujimura et al.

* cited by examiner

13

$12\begin{cases}15 \\ 14\end{cases}$

26

21

22

Z

Y

19

32

24A

26A

30

31

26

13 { 17
      18

ELECTRIC DEVICE

CROSS-REFERENCE TO RELATED APPLICATIONS

This application is the U.S. national stage of PCT/JP2022/031188 filed on Aug. 18, 2022, which claims priority of Japanese Patent Application No. JP 2021-143693 filed on Sep. 3, 2021, the contents of which are incorporated herein.

TECHNICAL FIELD

The present disclosure relates to an electric device.

BACKGROUND

An electric device disclosed in JP 2018-206601A is known as a conventional electric device. The disclosed electric device includes a base member, electronic components disposed on the base member, and busbars to which terminals of the electronic components are connected. The terminals of the electronic components and the busbars are electrically connected to each other as a result of being bolted to each other.

Laser welding is conceivable as a means for connecting the terminals of the electronic components and the busbars to each other, for example. When a terminal of an electronic component is laser-welded to a busbar, the terminal of the electronic component and the busbar are held so that no positional shifting occurs.

Thus, it is conceivable to use a dedicated jig to hold the relative positions between the terminal of the electronic component and the busbar.

Recent years have seen demands for reductions in the size of the electric device. In order to reduce the size of the electric device, electronic components need to be disposed on a circuit board in a highly dense manner. In doing so, problems arise where spaces between the electronic components disposed on the electric device are relatively small, and sufficient space for disposing the jig for holding the terminals of the electronic components and the busbars cannot be provided.

The present disclosure was completed based on the aforementioned issues, and it is an object to provide an electric device with a reduced size.

SUMMARY

The present disclosure is an electric device including: a case; an electronic component having a terminal and disposed in the case; and a busbar disposed in the case and laser-welded to the terminal of the electronic component, wherein the terminal of the electronic component and the busbar overlap each other, the case has an opening portion, and one or both of the terminal of the electronic component and the busbar are exposed to the outside of the case through the opening portion, the case further has a first sandwiching portion configured to come into contact with one of the terminal of the electronic component and the busbar, and a second sandwiching portion configured to come into contact with the other of the terminal of the electronic component and the busbar, and relative positions of the terminal of the electronic component and the busbar are held as a result of sandwiching by the first sandwiching portion and the second sandwiching portion.

Advantageous Effects

According to the present disclosure, the size of the electric device can be reduced.

DETAILED DESCRIPTION OF PREFERRED EMBODIMENTS

Figure 1:
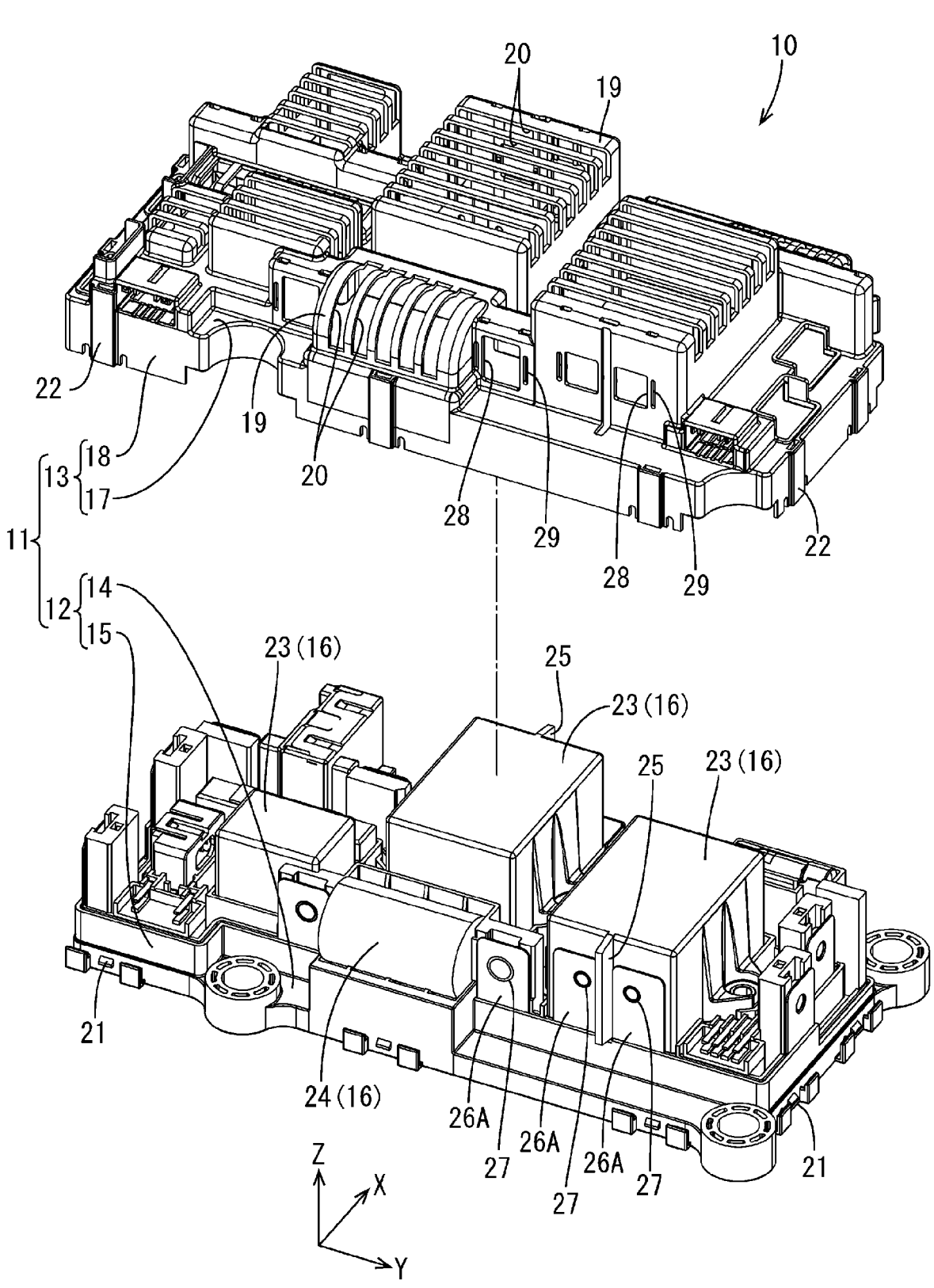
FIG. 1 is an exploded perspective view showing an electric device according to an embodiment.

First, embodiments of this disclosure will be listed and described below.

An electric device according to the present disclosure including: a case; an electronic component having a terminal and disposed in the case; and a busbar disposed in the case and laser-welded to the terminal of the electronic component, wherein the terminal of the electronic component and the busbar overlap each other, the case has an opening portion, and one or both of the terminal of the electronic component and the busbar are exposed to the outside of the case through the opening portion, the case further has a first sandwiching portion configured to come into contact with one of the terminal of the electronic component and the busbar, and a second sandwiching portion configured to come into contact with the other of the terminal of the electronic component and the busbar, and relative positions of the terminal of the electronic component and the busbar are held as a result of sandwiching by the first sandwiching portion and the second sandwiching portion.

The relative positions of the terminal of the electronic component and the busbar are held as a result of sandwiching by the first sandwiching portion and the second sandwiching portion provided on the case. Thus, by irradiating the terminal of the electronic component or the busbar with a laser beam via the opening portion of the case, the terminal of the electronic component and the busbar can be laser-welded to each other. With this disclosure, there is no need for a jig for holding the relative positions between the terminal of the electronic component and the busbar, and thus there is no need to provide a space for the jig. Consequently, the size of the electric device can be reduced.

It is preferable that the first sandwiching portion or the second sandwiching portion has a recess on a surface facing the terminal of the electronic component or the busbar.

Even if a laser beam burns through the terminal of the electronic component and the busbar when the terminal of the electronic component and the busbar are being laser-welded to each other, the first sandwiching portion or the second sandwiching portion is kept from being damaged by a laser beam due to the recess provided on either the first sandwiching portion or the second sandwiching portion.

It is preferable that the case includes a lower case to which the electronic component is attached, and an upper case configured to cover the electronic component when attached to the lower case, and the upper case is provided with the first sandwiching portion and the lower case is provided with the second sandwiching portion.

With a simple operation of assembling the lower case and the upper case together, the terminal of the electronic component and the busbar can be sandwiched by the first sandwiching portion and the second sandwiching portion.

It is preferable that the upper case has an upper wall configured to cover the electronic component, the lower case has a bottom wall on which the electronic component is disposed, the upper wall of the upper case is provided with a housing protrusion protruding away from the bottom wall of the lower case and in which the electronic component is individually housed, at a position corresponding to the electronic component, and the first sandwiching portion is provided on the housing protrusion of the upper case, and the second sandwiching portion is provided on the bottom wall of the lower case.

The electronic component is individually housed in the housing protrusion provided on the upper case, and thus the size of the upper case can be reduced compared to a case where multiple electronic components are collectively covered by the upper case. Accordingly, the size of the overall electric device can be reduced.

It is preferable that the opening portion is provided in the housing protrusion of the upper case, and the housing protrusion of the upper case has a protrusion that protrudes toward the terminal of the electronic component or the busbar and abuts against the one of the terminal of the electronic component and the busbar, at a position near a hole edge portion of the opening portion.

The terminal of the electronic component or the busbar is pressed by the protrusion, and thus relative positional shifting between the terminal of the electronic component and the busbar is further suppressed.

It is preferable that the upper case has a slit extending along the hole edge portion of the opening portion, and the protrusion is provided in a region between the hole edge portion of the opening portion and a hole edge portion of the slit.

As a result of the region between the hole edge portion of the opening portion of the upper case and the slit elastically deforming, the protrusion is pressed against the terminal of the electronic component or the busbar. Accordingly, relative positional shifting between the terminal of the electronic component and the busbar can be further suppressed while accounting for a tolerance set for the terminal of the electronic component and a tolerance set for the busbar.

It is preferable that the upper case is attached to the lower case along an attachment direction, a normal line of a plate surface of the terminal of the electronic component is orthogonal to the attachment direction, a normal line of the busbar is orthogonal to the attachment direction, and the first sandwiching portion and the second sandwiching portion are assembled to the terminal of the electronic component and the busbar from the attachment direction.

With a simple operation of assembling the lower case and the upper case together, the terminal of the electronic component and the busbar can be sandwiched by the first sandwiching portion and the second sandwiching portion.

Embodiments of the present disclosure will be described below. The present disclosure is not limited to these examples, but is indicated by the claims, and all changes that come within the meaning and range of equivalency of the claims are intended to be embraced therein.

Embodiments of the present disclosure will be described with reference to FIGS. 1 to 8. An electric device 10 according to the present embodiment is mounted in a vehicle such as an electric car or hybrid car (not shown), and turns a current supplied from a power source (not shown) on and off. In the following description, the direction indicated by the Z arrow is the upward direction, the direction indicated by the Y arrow is the forward direction, and the direction indicated by the X arrow is the leftward direction with the Y arrow indicating the forward direction. Further, for identical members, only some of the members may be given reference signs while other members are not given reference signs.

As shown in FIG. 1, the electric device 10 includes a case 11 and electronic components 16 installed in the case 11. The case 11 has a lower case 12 on the lower side, and an upper case 13 attached to the upper side of the lower case 12. The upper case 13 is configured to be attached to the lower case 12 from above (an example of an attachment direction).

The lower case 12 is made of an insulative synthetic resin and is open upward. The lower case 12 has a rectangular shape as seen from above. The lower case 12 has a bottom wall 14 and a housing wall 15 extending upward from the upper surface of the bottom wall 14. The electronic components 16 are housed in the space surrounded by the bottom wall 14 and the housing wall 15.

The upper case 13 is made of an insulative synthetic resin and is open downward. The upper case 13 is slightly larger than the external shape of the lower case 12. The upper case 13 has an upper wall 17 and side walls 18 extending downward from the side edges of the upper wall 17. In a state where the lower case 12 and the upper case 13 are assembled to each other, the side walls 18 of the upper case 13 are located outward of the bottom wall 14 of the lower case 12.

Figure 2:
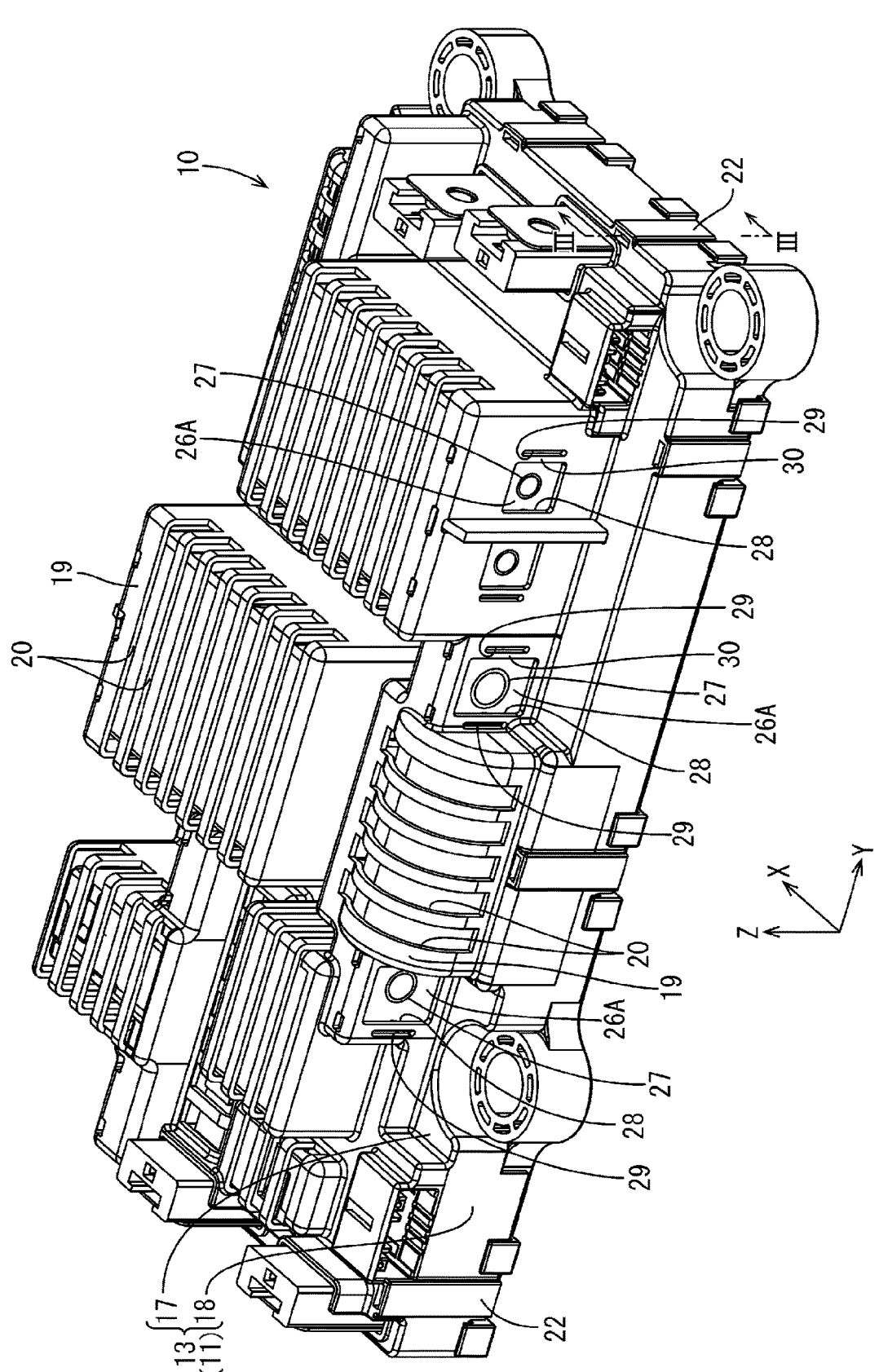
FIG. 2 is a perspective view showing the electric device.

The upper wall 17 of the upper case 13 is provided with a housing protrusion 19 that protrudes upward and is shaped so as to conform to the shape of one of the electronic components 16 at a position corresponding to the one electronic component 16 attached to the lower case 12. As shown in FIG. 2, the corresponding electronic component 16 is individually housed in the housing protrusion 19. The housing protrusion 19 is provided with slits 20 that are arranged spaced apart from each other. Thus, the inside and outside of the case 11 are in communication with each other. As a result, heat generated by the electronic component 16 when a current flows through the electronic component 16 is dispersed out of the case 11 via the slits 20.

Figure 3:
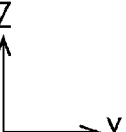
FIG. 3 is a cross-sectional view taken along line III-III in FIG. 2.

As shown in FIG. 1, lock protrusions 21 protrude outward from side surfaces of the bottom wall 14 of the lower case 12. Side walls 18 of the upper case 13 are provided with lock receiving portions 22 that elastically engage with the lock protrusions 21 of the lower case 12 at positions that correspond to the lock protrusions 21. As shown in FIG. 3, as a result of the lock protrusions 21 and the lock receiving portions 22 elastically engaging with each other, the lower case 12 and the upper case 13 are integrally assembled as one piece.

As shown in FIG. 1, the electronic components 16 have terminals 16A. The electronic components 16 attached to the lower case 12 include relays 23 and a fuse 24.

Each relay 23 is electrically connected to a power source and turns the current supplied from the power source on and off. The relay 23 has terminals (not shown, and example of the terminal 16A). The relay 23 has a parallelepiped shape. One side surface of the relay 23 is provided with a protruding partition wall 25 that extends in an up-down direction. Among the side walls of the relay 23, the side wall provided with the partition wall 25 is provided with metal plate-shaped terminals on opposite sides of the partition wall 25. The creeping distance between the two terminals is set by the partition wall 25 provided between the two terminals. The normal lines of the terminals of the relay 23 are orthogonal to the up-down direction. Note that, "orthogonal to the up-down direction" includes cases of being orthogonal to the up-down direction and cases where normal lines are recognized as being substantially orthogonal even if they are not orthogonal. By laser-welding the terminals of the relay 23 to busbars 26, the terminals and the busbars 26 are electrically connected to each other.

The fuse 24 melts when a current greater than a predetermined current flows through the fuse 24. Thus, an overcurrent can be kept from flowing from the power source. The fuse 24 has an overall cylindrical shape extending in the front-rear direction. A terminal 24A (example of terminal 16A) extends forward from the front end portion of the fuse 24, and a terminal 24A (example of terminal 16A) extends rearward from the rear end portion of the fuse 24. The terminals 24A of the fuse 24 are made of metal plates and have a rectangular shape as seen from the left-right direction. The normal lines of the terminals 24A of the fuse 24 are orthogonal to the up-down direction. As a result of the terminals 24A being laser welded to busbars 26, the terminals 24A and the busbars 26 are electrically connected to each other.

As shown in FIG. 1, the lower case 12 is provided with a plurality of busbars 26. The busbars 26 are fixed to the lower case 12 using a known method such as press fitting, adhesion, screwing, heat fusion, or the like. The busbars 26 are formed by pressing a conductive metal plate member into a predetermined shape. The metal forming the busbars 26 is selected as necessary from copper, a copper alloy, or the like.

The busbars 26 respectively overlap the terminals of the relay 23 and the terminals 24A of the fuse 24. Each busbar 26 has connection portions 26A that are each connected to a terminal of the relay 23 or a terminal 24A of the fuse 24. The busbars 26 are provided on the lower case 12 such that normal lines of the connection portions 26A of the busbars 26 are orthogonal to the up-down direction. The terminals of the relay 23 and the terminals 24A of the fuse 24 are laser-welded to the connection portions 26A of the busbars 26. Welding marks 27 are formed on the busbars 26 as a result of performing laser-welding. The shape of the welding marks 27 is not particularly limited, but is substantially circular in the present embodiment.

As shown in FIG. 2, the housing protrusion 19 of the upper case 13 is provided with opening portions 28 that extend through the housing protrusion 19 at positions corresponding to the connection portions 26A of the busbars 26. The connection portions 26A of the busbars 26 are exposed to the outside of the case 11 from inside the hole edge portions of the opening portions 28. The shape of the hole edge portions of the opening portions 28 is not particularly limited, but is rectangular in the present embodiment.

In the following description, the terminals 24A of the fuse 24 and the connection portions 26A of the busbars 26 overlaid on the terminals 24A of the fuses 24 will be described as an example. For the terminals of the relays 23 and the connection portions 26A of the busbars 26 overlapping the terminals of the relays 23, the same reference signs are given to like members and redundant description is omitted.

Figure 4:
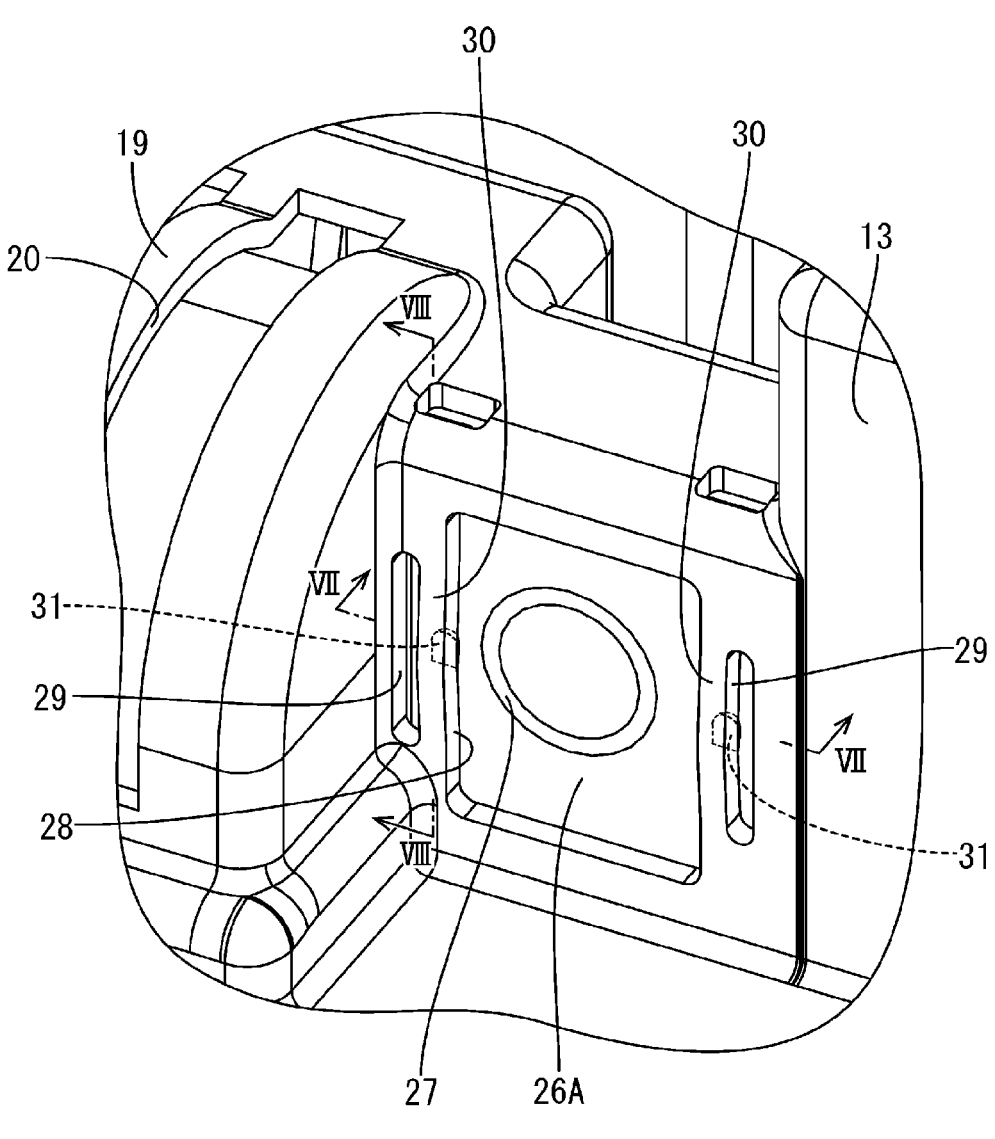
FIG. 4 is a partially enlarged perspective view showing an opening portion of an upper case.
Figure 4:
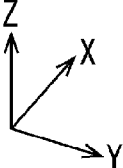

As shown in FIG. 4, the housing protrusion 19 of the upper case 13 is provided with slits 29 extending in the up-down direction at positions slightly forward and rearward of the hole edge portion of each opening portion 28. Each region of the housing protrusion 19 of the upper case 13 defined by a hole edge portion of an opening portion 28 and a slit 29 is a first sandwiching portion 30. The first sandwiching portions 30 extend in an elongated shape in the up-down direction. Each first sandwiching portion 30 is formed as a spring held on two sides, and is elastically deformable in the left-right direction. The first sandwiching portions 30 are respectively formed on the front and rear sides of each opening portion 28.

Figure 5:
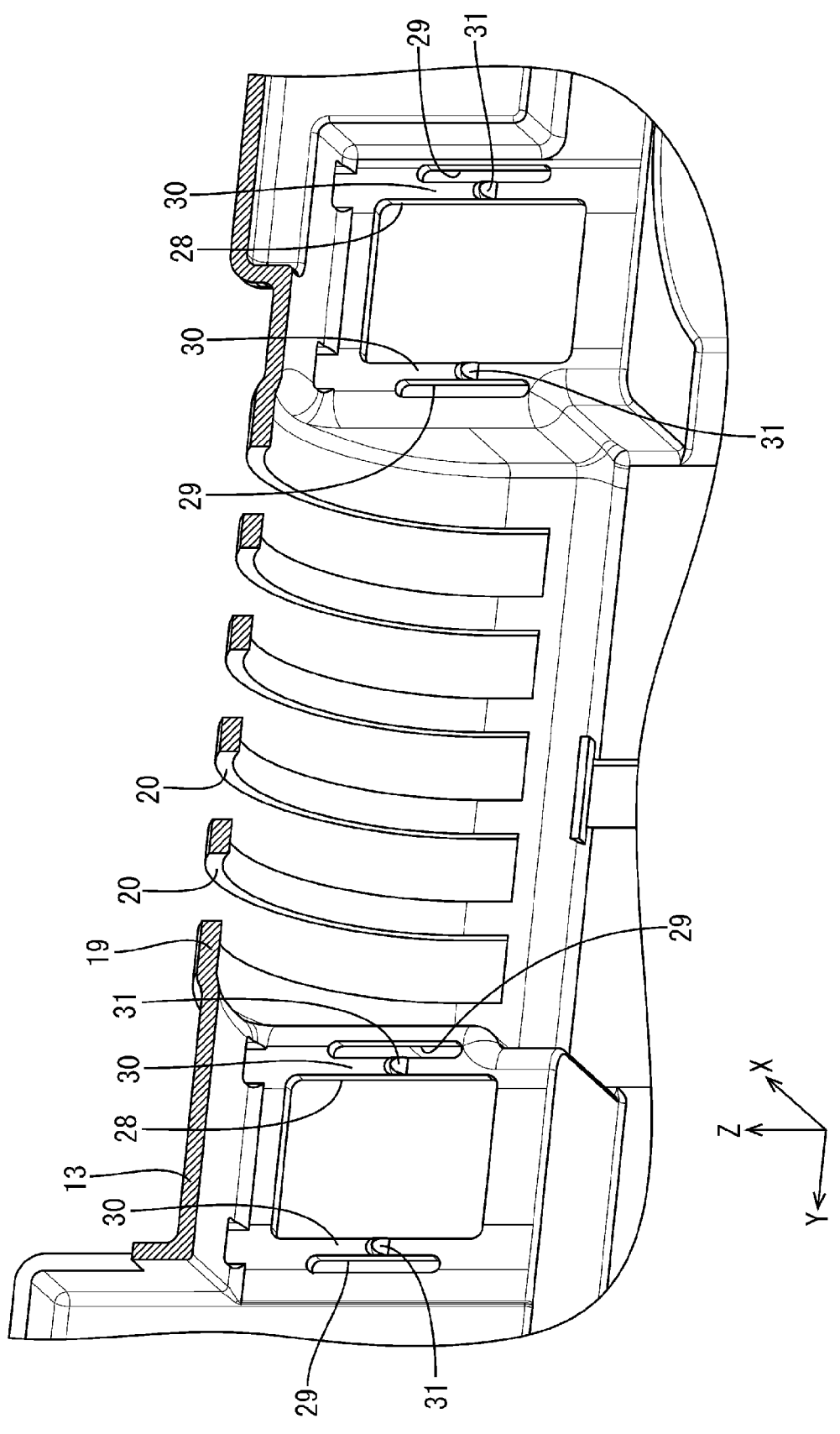
FIG. 5 is a partial cut-out perspective view showing a protrusion provided on the upper case.

As shown in FIG. 5, each first sandwiching portion 30 is provided with a protrusion 31 that protrudes toward the connection portion 26A of the busbar 26, near the center in the up-down direction on the surface that faces the connection portion 26A of the busbar 26. In a state where the upper case 13 has been assembled to the lower case 12, the leading end portions of the protrusions 31 abut against the connection portions 26A of the busbars 26 from the right.

Figure 6:
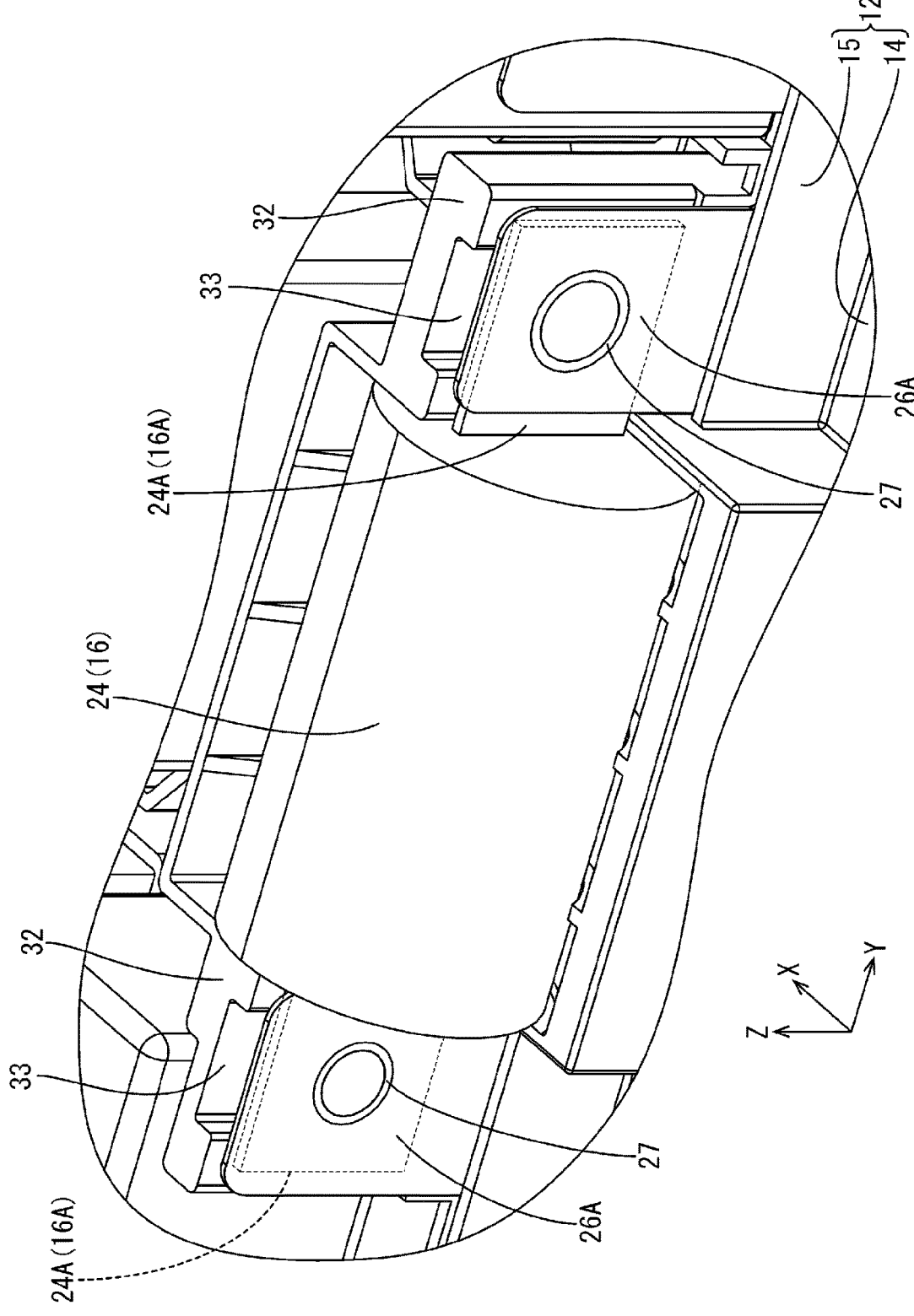
FIG. 6 is a partially enlarged perspective view showing a connection structure for connection of a terminal of a fuse and a connection portion of a busbar.

As shown in FIG. 6, the upper surface of the bottom wall 14 of the lower case 12 is provided with second sandwiching portions 32 that protrude upward in a wall shape at positions corresponding to the terminals 24A of the fuse 24. The second sandwiching portions 32 abut against the terminals 24A of the fuse 24 from the left.

Figure 7:
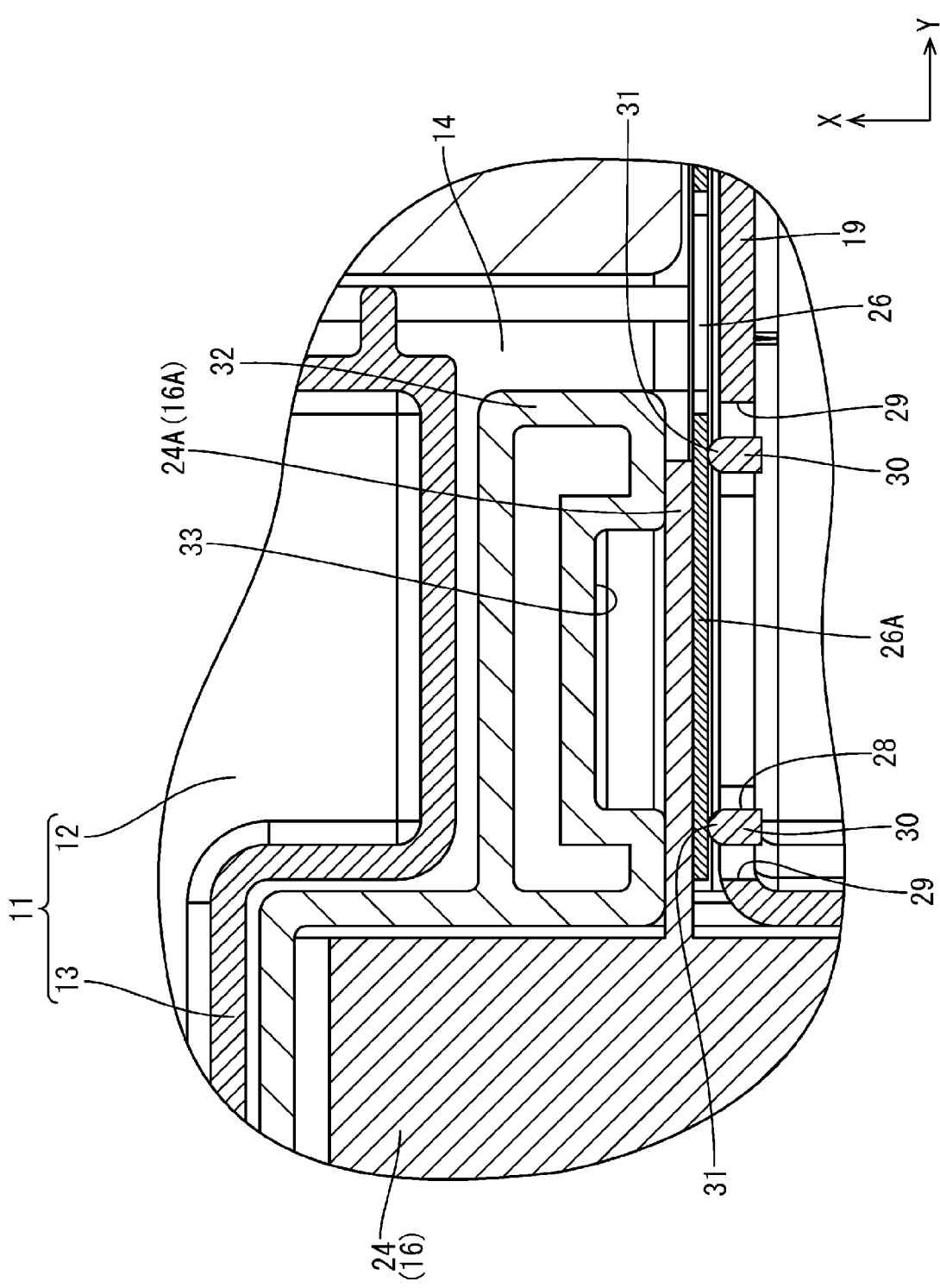
FIG. 7 is a cross-sectional view taken along line VII-VII in FIG. 4.

As shown in FIG. 7, as a result of each second sandwiching portion 32 abutting against a terminal 24A of the fuse 24 from the left and the first sandwiching portion 30 abutting against, from the right, the connection portion 26A of the busbar 26 overlapping the terminal 24A of the fuse 24, the terminal 24A of the fuse 24 and the connection portion 26A of the busbar 26 are sandwiched by the second sandwiching portion 32 and the first sandwiching portion 30.

Figure 8:
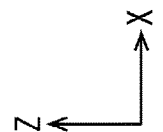
FIG. 8 is a cross-sectional view taken along line VIII-VIII in FIG. 4.

As shown in FIG. 8, while a protrusion of the first sandwiching portion 30 abuts against the connection portion 26A of the busbar 26 from the right, the first sandwiching portion 30 flexibly deforms so as to bulge to the right. Accordingly, the connection portion 26A of the busbar 26 is pressed toward the terminal 24A of the fuse 24. Thus, relative positional shifting between the terminal 24A of the fuse 24 and the connection portion 26A of the busbar 26 is suppressed.

As shown in FIG. 7, the surface of the second sandwiching portion 32 facing the terminal 24A of the fuse 24 is provided with a recess 33 that is recessed away from the terminal 24A of the fuse 24. At the portion of the second sandwiching portion 32 provided with the recess 33, the second sandwiching portion 32 and the terminal 24A of the fuse 24 are separated from one another.

Next, an example of a manufacturing process for the electric device 10 will be described. The manufacturing process for the electric device 10 is not limited to that described below.

Electronic components 16 such as the relay 23 and the fuse 24 are fixed to the upper surface of the lower case 12. Next, the busbars 26 are fixed to the upper surface of the lower case 12. In this state, terminals of the relay 23 and connection portions 26A of the busbars 26 are overlapped, and the terminals 24A of the fuse 24 and connection portions 26A of the busbars 26 are overlapped.

The upper case 13 is assembled to the lower case 12 from above. In response to the lower end portions of the lock receiving portions 22 of the upper case 13 abutting against the lock protrusions 21 of the lower case 12 from above, the lock receiving portions 22 elastically deform. Furthermore, when the upper case 13 is pressed down, the lock receiving portions 22 move over the lock protrusions 21 and deform so as to revert to their original state. Thus, the lock receiving portions 22 abut against the lock protrusions 21 from below. Accordingly, the upper case 13 is fixed to the lower case 12.

In the state where the lower case 12 and the upper case 13 are assembled, leading end portions of the protrusions 31 provided on the first sandwiching portions 30 of the upper case 13 abut against the terminals 24A of the fuse 24 from the right. Also, the second sandwiching portions 32 of the lower case 12 abut against the terminals 24A of the fuse 24 from the left. Thus, the terminals 24A of the fuse 24 and the connection portions 26A of the busbars 26 are sandwiched by the first sandwiching portions 30 and the second sandwiching portions 32.

A laser beam is emitted from an irradiation device (not shown) through the opening portions 28 of the upper case 13. Thus, the terminals 24A of the fuse 24 and the connection portions 26A of the busbars 26 are laser-welded to each other. The welding marks 27 are formed on the connection portions 26A of the busbars 26. Thus, the terminals 24A of the fuse 24 and the connection portions 26A of the busbar 26 are electrically connected to each other.

The terminals of the relay 23 and connection portions 26A of the busbars 26 are also laser-welded to each other in a similar fashion, and thus a redundant description thereof is omitted. Thus, the electric device 10 is complete.

Operation and effects of the present embodiment will be described below. An electric device 10 according to the present embodiment including: a case 11; an electronic component 16 having a terminal and disposed in the case 11; and a busbar 26 disposed in the case 11 and laser-welded to the terminal 16A of the electronic component 16, wherein the terminal 16A of the electronic component 16 and the busbar 26 overlap each other, the case 11 has an opening portion 28, and one or both of the terminal 16A of the electronic component 16 and the busbar 26 are exposed to the outside of the case 11 from the opening portion 28, the case 11 further has a first sandwiching portion 30 configured to come into contact with one of the terminal 16A of the electronic component 16 and the busbar 26, and a second sandwiching portion 32 configured to come into contact with the other of the terminal 16A of the electronic component 16 and the busbar 26, and relative positions between the terminal 16A of the electronic component 16 and the busbar 26 are held as a result of sandwiching by the first sandwiching portion 30 and the second sandwiching portion 32.

Relative positions of the terminal 16A of the electronic component 16 and the busbar 26 are held as a result of being sandwiched by the first sandwiching portion 30 and the second sandwiching portion 32 provided on the case 11. Thus, by irradiating the terminal 16A of the electronic component 16 or the busbar 26 with a laser beam via the opening portion 28 of the case 11, the terminal 16A of the electronic component 16 and the busbar 26 can be laser-welded to each other. With this disclosure, there is no need for a jig for holding the relative positions of the terminal 16A of the electronic component 16 and the busbar 26, and thus there is no need to provide a space for the jig. Consequently, the size of the electric device 10 can be reduced.

Also, with the present embodiment, the second sandwiching portion 32 has the recess 33 on a surface that faces the terminal 16A of the electronic component 16.

Even if a laser beam burns through the terminal 16A of the electronic component 16 and the busbar 26 when the terminal 16A of the electronic component 16 and the busbar 26 are being laser-welded to each other, the second sandwiching portion 32 is kept from being damaged by a laser beam due to the recess 33 provided on the second sandwiching portion 32.

According to the present embodiment, the case 11 has the lower case 12 to which the electronic component 16 is attached, and the upper case 13 that covers the electronic component 16 when attached to the lower case 12, the upper case 13 has the first sandwiching portion 30, and the lower case 12 has the second sandwiching portion 32.

With a simple operation of assembling the lower case 12 and the upper case 13 to each other, the terminal 16A of the electronic component 16 and the busbar 26 can be sandwiched by the first sandwiching portion 30 and the second sandwiching portion 32.

According to this embodiment, the upper case 13 has the upper wall 17 covering the electronic component 16, the lower case 12 has the bottom wall 14 on which the electronic component 16 is disposed, the upper wall 17 of the upper case 13 is provided with the housing protrusion 19 that protrudes away from the bottom wall 14 of the lower case 12 and in which the electronic component 16 is individually housed, at a position corresponding to the electronic component 16, the first sandwiching portion 30 is provided on the housing protrusion 19 of the upper case 13, and the second sandwiching portion 32 is provided on the bottom wall 14 of the lower case 12.

The electronic component 16 is individually housed in the housing protrusion 19 provided on the upper case 13, and thus the size of the upper case 13 can be reduced compared to a case where multiple electronic components 16 are collectively covered by the upper case 13. Accordingly, the size of the overall electric device 10 can be reduced.

According to this embodiment, the opening portion 28 is provided on the housing protrusion 19 of the upper case 13, and the housing protrusion 19 of the upper case 13 has a protrusion 31 that protrudes toward the terminal 16A of the electronic component 16 or the busbar 26 and abuts against the one of the terminal 16A of the electronic component 16 or the busbar 26, at a position near a hole edge portion of the opening portion 28.

The terminal 16A of the electronic component 16 or the busbar 26 is pressed by the protrusion 31, and thus relative positional shifting between the terminal 16A of the electronic component 16 and the busbar 26 is further suppressed.

According to the present embodiment, the upper case 13 has a slit 29 extending along the hole edge portion of the opening portion 28, and the protrusion 31 is provided in a region between the hole edge portion of the opening portion 28 and a hole edge portion of the slit 29.

As a result of the region between the hole edge portion of the opening portion 28 of the upper case 13 and the slit 29 elastically deforming, the protrusion 31 is pressed against the terminal 16A of the electronic component 16 or the busbar 26. Accordingly, relative positional shifting between the terminal 16A of the electronic component 16 and the busbar 26 can be further suppressed while accounting for a tolerance set for the terminal 16A of the electronic component 16 and a tolerance set for the busbar 26.

According to the present embodiment, the upper case 13 is attached to the lower case 12 along the attachment direction, a normal line of a plate surface of the terminal 16A of the electronic component 16 is orthogonal to the attachment direction, a normal line of the plate surface of the busbar 26 is orthogonal to the attachment direction, and the first sandwiching portion 30 and the second sandwiching portion 32 are assembled to the terminal 16A of the electronic component 16 and the busbar 26 from the attachment direction.

With a simple operation of assembling the lower case 12 and the upper case 13 together, the terminal 16A of the electronic component 16 and the busbar 26 can be sandwiched by the first sandwiching portion 30 and the second sandwiching portion 32.

Other Embodiments

The opening portion 28 may be provided in the lower case 12.

The recess 33 may be omitted.

The slits 20 provided in the housing protrusion 19 may be omitted.

The protrusions 31 may have a thin elongated shape extending in the up-down direction spanning the entire length of the first sandwiching portions 30. Also, a plurality of the protrusions 31 may be provided on each first sandwiching portion 30.

The terminals 16A of the electronic component 16 may be disposed so to as to be externally exposed. In this case, a configuration may be employed where the first sandwiching portions 30 abut against the terminals 16A of the electronic components 16 and the second sandwiching portions 32 abut against the connection portions 26A of the busbars 26.

Both the first sandwiching portions 30 and the second sandwiching portions 32 may be provided on the lower case 12 or on the upper case 13.

The shape of the hole edge portion of the opening portions 28 may be any shape including a polygonal shape such as a triangle, a pentagon, or a hexagon, a circular shape, or an oval shape.

The invention claimed is:

1. An electric device comprising:
a case;
an electronic component having a terminal and disposed in the case; and
a busbar disposed in the case and laser-welded to the terminal of the electronic component,
wherein the terminal of the electronic component and the busbar overlap each other,
the case has an opening portion, and one or both of the terminal of the electronic component and the busbar are exposed to the outside of the case through the opening portion,
the case further has a first sandwiching portion configured to come into contact with one of the terminal of the electronic component and the busbar, and a second sandwiching portion configured to come into contact with the other of the terminal of the electronic component and the busbar, and
relative positions of the terminal of the electronic component and the busbar are held as a result of sandwiching by the first sandwiching portion and the second sandwiching portion.

2. The electric device according to claim 1, wherein the first sandwiching portion or the second sandwiching portion has a recess on a surface facing the terminal of the electronic component or the busbar.

3. The electric device according to claim 1, wherein the case includes a lower case to which the electronic component is attached, and an upper case configured to cover the electronic component when attached to the lower case, and
the upper case is provided with the first sandwiching portion and the lower case is provided with the second sandwiching portion.

4. The electric device according to claim 3,
wherein the upper case has an upper wall configured to cover the electronic component,
the lower case has a bottom wall on which the electronic component is disposed,
the upper wall of the upper case is provided with a housing protrusion protruding away from the bottom wall of the lower case and in which the electronic component is individually housed, at a position corresponding to the electronic component, and
the first sandwiching portion is provided on the housing protrusion of the upper case, and the second sandwiching portion is provided on the bottom wall of the lower case.

5. The electric device according to claim 4,
wherein the opening portion is provided in the housing protrusion of the upper case, and
the housing protrusion of the upper case has a protrusion that protrudes toward the terminal of the electronic component or the busbar and abuts against the one of the terminal of the electronic component and the busbar, at a position near a hole edge portion of the opening portion.

6. The electric device according to claim 5,
wherein the upper case has a slit extending along the hole edge portion of the opening portion, and
the protrusion is provided in a region between the hole edge portion of the opening portion and a hole edge portion of the slit.

7. The electric device according to claim 3,
wherein the upper case is attached to the lower case along an attachment direction,
a normal line of a plate surface of the terminal of the electronic component is orthogonal to the attachment direction,
a normal line of the busbar is orthogonal to the attachment direction, and
the first sandwiching portion and the second sandwiching portion are assembled to the terminal of the electronic component and the busbar from the attachment direction.

8. The electric device according to claim 2,
wherein the case includes a lower case to which the electronic component is attached, and an upper case configured to cover the electronic component when attached to the lower case, and
the upper case is provided with the first sandwiching portion and the lower case is provided with the second sandwiching portion.

9. The electric device according to claim 4,
wherein the upper case is attached to the lower case along an attachment direction,
a normal line of a plate surface of the terminal of the electronic component is orthogonal to the attachment direction,
a normal line of the busbar is orthogonal to the attachment direction, and
the first sandwiching portion and the second sandwiching portion are assembled to the terminal of the electronic component and the busbar from the attachment direction.

10. The electric device according to claim 5, wherein the upper case is attached to the lower case along an attachment direction, a normal line of a plate surface of the terminal of the electronic component is orthogonal to the attachment direction, a normal line of the busbar is orthogonal to the attachment direction, and the first sandwiching portion and the second sandwiching portion are assembled to the terminal of the electronic component and the busbar from the attachment direction.

11. The electric device according to claim 6, wherein the upper case is attached to the lower case along an attachment direction, a normal line of a plate surface of the terminal of the electronic component is orthogonal to the attachment direction, a normal line of the busbar is orthogonal to the attachment direction, and the first sandwiching portion and the second sandwiching portion are assembled to the terminal of the electronic component and the busbar from the attachment direction.

\* \* \* \* \*